United States Patent [19]

Kadwell et al.

[11] Patent Number: 5,015,827
[45] Date of Patent: May 14, 1991

[54] CONTROL SYSTEM FOR A COOKING OVEN

[75] Inventors: Brian J. Kadwell, Ringgold, Ga.; Daniel L. Fowler, Kentwood, Mich.

[73] Assignee: Robert Shaw Controls Company, Richmond, Va.

[21] Appl. No.: 483,570

[22] Filed: Feb. 22, 1990

Related U.S. Application Data

[63] Continuation of Ser. No. 248,395, Sep. 23, 1988, Pat. No. 4,922,081.

[51] Int. Cl.$^5$ ............................................. H05B 1/02
[52] U.S. Cl. .................................... 219/497; 219/506; 219/413; 340/584
[58] Field of Search ............... 219/494, 497, 499, 501, 219/505, 506, 412, 413, 507–510, 519; 540/584, 582; 307/117

[56] References Cited

U.S. PATENT DOCUMENTS

| | | | |
|---|---|---|---|
| 3,566,079 | 2/1971 | O'Neill | 219/505 |
| 3,878,358 | 4/1975 | Burton et al. | 219/505 |
| 4,166,944 | 9/1979 | Scott | 219/506 |
| 4,206,344 | 6/1980 | Fischer et al. | 219/507 |
| 4,314,143 | 2/1982 | Bilstad et al. | 219/505 |
| 4,367,399 | 1/1983 | Anthony et al. | 219/505 |
| 4,415,800 | 11/1983 | Dodge et al. | 219/497 |
| 4,467,184 | 8/1984 | Loessel | 219/506 |
| 4,568,927 | 2/1986 | Fowler | 340/706 |
| 4,611,295 | 9/1986 | Fowler | 364/184 |
| 4,644,137 | 2/1987 | Asahi et al. | 219/497 |

*Primary Examiner*—M. H. Paschall
*Attorney, Agent, or Firm*—Candor, Candor & Tassone

[57] ABSTRACT

A control system and method of operating the control system are provided, the system having a supervisory circuit for detecting failure of the system and disabling a high energy control circuit of the system, the supervisory circuit having a capacitor therein for sustaining an on condition of a supervisory transistor that is in series with an output relay driver transistor of the high energy control circuit, and a temperature sensing unit that is disposed intermediate a microcomputer of the system and the supervisory circuit for continuing the charging of the capacitor only as long as the temperature sensing unit is sensing an output temperature effect of a heating unit of the system that is below a predetermined high temperature limit for the system and that terminates the charging of the capacitor when the sensed temperature is above the predetermined high temperature limit.

4 Claims, 6 Drawing Sheets

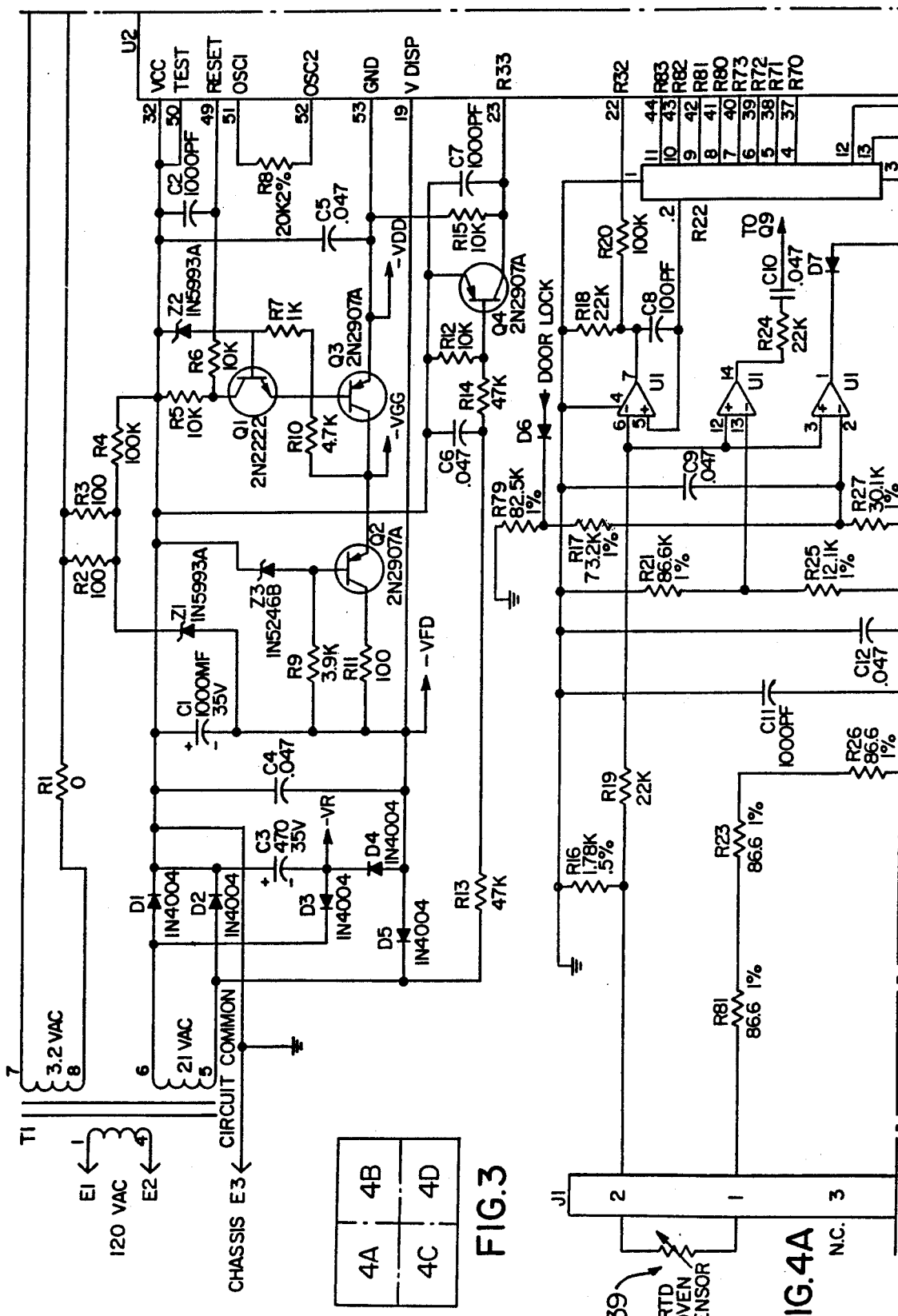

CONTROL SYSTEM FOR A COOKING OVEN

CROSS REFERENCE TO RELATED APPLICATION

This application is a continuation patent application of its copending parent patent application, Ser. No. 248,395 filed Sept. 23, 1988, now U.S. Pat. No. 4,922,081.

BACKGROUND OF THE INVENTION

1. Field of the Invention

This invention relates to a new control system and to a new method of operating the control system, the control system being particularly adapted to be utilized for controlling the operation of a cooking apparatus or the like.

2. Prior Art Statement

It is known to provide a control system comprising a high energy control circuit means having an output relay driver transistor for operating a heating means of the system, manually operated means for initiating the operation of the high energy control circuit means, microcomputer means for operating the high energy control circuit means after the manually operated means has initiated the operation thereof, and supervisory circuit means for detecting failure of the system and disabling the high energy control circuit means if the system is not operating in a normal mode thereof, the supervisory circuit means having means requiring the manual operation of the manually operated means before permitting power to reach the high energy control circuit means whereby the high energy control circuit means is disabled unless the manual operation of the manually operated means has taken place and the system is operating in the normal mode thereof, the supervisory circuit means having a supervisory transistor therein that is in series with the relay driver transistor and that must be switched on to enable the relay driver transistor, the supervisory circuit means having a capacitor therein for sustaining the on condition of the supervisory transistor, the manually operated means comprising means for initially charging the capacitor and switching on the supervisory transistor when the manually operated means has been manually operated to initiate the operation of the high energy control circuit means, the system having means for continuing the charging of the capacitor after the initial manual operation of the manually operated means if the system is operating in a normal mode thereof. For example, see the copending patent application, Ser. No. 939,872, filed Dec. 10, 1987 now U.S. Pat. No. 4,782,215.

It is also known to provide a control system for a cooking oven having a heating means and an oven door, the system comprising a high energy control circuit means having an output relay driver transistor for operating an oven door latching motor means of the system, manually operated means for initiating the operation of the high energy control circuit means, microcomputer means for operating the high energy control circuit means after the manually operated means has initiated the operation thereof, and supervisory circuit means for detecting failure of the system and disabling the high energy control circuit means if the system is not operating in a normal mode thereof. For example, see the aforementioned copending patent application, Ser. No. 939,872, filed Dec. 10, 1987.

SUMMARY OF THE INVENTION

It is one feature of this invention to provide a control system having a unique supervisory circuit means for monitoring the high energy control circuit means thereof.

In particular, it was found according to the teachings of this invention that the continuous charging of the sustaining capacitor for the supervisory transistor of the supervisory circuit means can be provided by the temperature sensing means of the system so that not only will software limits control the operation of the high energy control circuit means of the system, but also the hardware limits being provided by the temperature sensing means will control the operation of the high energy control circuit means.

For example, the control system can be utilized for controlling the heating means of a cooking apparatus and the software of the microcomputer means can provide a predetermined high temperature limit for the system, such as 600° F., so that should the output temperature effect of the treating means exceed such high temperature limit, the microcomputer means will terminate the operation of the high energy control circuit means that controls the heating means. However, in addition, the temperature sensing means of the system can have a higher predetermined high temperature limit, such as 635° F., so that should the output temperature effect of the heating means exceed this high temperature limit of the temperature sensing means, the supervisory circuit means will terminate the operation of the high energy control circuit means that controls the heating means whereby this hardware limit is redundant to the software limit.

Thus, one embodiment of this invention provides a control system comprising a high energy control circuit means having an output relay driver transistor for operating a heating means of the system, manually operated means for initiating the operation of the high energy control circuit means, microcomputer means for operating the high energy control circuit means after the manually operated means has initiated the operation thereof, and supervisory circuit means for detecting failure of the system and disabling the high energy control circuit means if the system is not operating in a normal mode thereof, the supervisory circuit means having means requiring the manual operation of the manually operated means before permitting power to reach the high energy control circuit means whereby the high energy control circuit means is disabled unless the manual operation of the manually operated means has taken place and the system is operating in the normal mode thereof, the supervisory circuit means having a supervisory transistor therein that is in series with the relay driver transistor and that must be switched on to enable the relay driver transistor, the supervisory circuit means having a capacitor therein for sustaining the on condition of the supervisory transistor, the manually operated means comprises means for initially charging the capacitor and switching on the supervisory transistor when the manually operated means has been manually operated to initiate the operation of the high energy control circuit means, the system having means for continuing the charging of the capacitor after the initial manual operation of the manually operated means if the system is operating in a normal mode thereof, the means for continuing the charging of the capacitor comprising temperature sensing means that is disposed intermediate the microcomputer means and the supervisory circuit means and continuing the charging of the capacitor only as long as the temperature sensing means is sensing an output temperature effect of the heating means that is below a predetermined high temperature limit for the system and that terminates the charging of the capacitor when the sensed temperature is above the predetermined high temperature limit.

It is another feature of this invention to use the temperature sensing means of the system to monitor the operation of the door latching motor means of the control system when the system is being used to control the high temperature burn-off cleaning function of the heating means of an oven of a cooking apparatus.

For example, the software of the microcomputer means of the system can provide a predetermined high temperature limit for the system, such as 585° F., so that when the output temperature effect of the heating means exceeds such high temperature limit, the microcomputer means will terminate the operation of the high energy control circuit means that controls the door latching motor means so that such motor means cannot be operated to unlatch the oven door until the output temperature effect falls below the 585° F. limit. However, in addition, the temperature sensing means of the system can have a higher predetermined high temperature limit, such as 535° F., so that should the output temperature effect of the heating means exceed this high temperature limit of the temperature sensing means, the supervisory circuit means will terminate the operation of the high energy control circuit means that controls the door latching motor means whereby this hardware limit is redundant to the software limit.

Thus, another embodiment of this invention provides a control for a cooking oven having a heating means and an oven door, the system comprising a high energy control circuit means having an output relay driver transistor for operating an oven door latching motor means of the system, manually operated means for initiating the operation of the high energy control circuit means, microcomputer means for operating the high energy control circuit means after the manually operated means has initiated the operation thereof, and supervisory circuit means for detecting failure of the system and disabling the high energy control circuit means if the system is not operating in a normal mode thereof, the supervisory circuit means having a supervisory transistor therein that is in series with the relay driver transistor and that must be switched on to enable the relay driver transistor, the supervisory circuit means having a capacitor therein for sustaining the on condition of the supervisory transistor, the system having operating means for initially charging the capacitor and switching on the supervisory transistor to initiate the operation of the high energy control circuit means, the operating means being adapted to continue the charging of the capacitor after the initial charging thereof if the system is operating in a normal mode thereof, the operating means for continuing the charging of the capacitor comprising temperature sensing means that is disposed intermediate the microcomputer means and the supervisory circuit means and continues the charging of the capacitor only as long as the temperature sensing means is sensing an output temperature effect of the heating means that is below a predetermined high temperature limit for the system and that terminates the charging of the capacitor when the sensed temperature is above the predetermined high temperature limit.

Accordingly, it is an object of this invention to provide a new control system having one or more of the novel features of this invention as set forth above or hereinafter shown or described.

Another object of this invention is to provide a new method of making such a control unit, the method of this invention having one or more of the novel features of this invention as set forth above or hereinafter shown or described.

Another object of this invention is to provide a new method of operating such a control system, the method of this invention having one or more of the novel features of this invention as set forth above or hereinafter shown or described.

Other objects, uses and advantages of this invention are apparent from a reading of this description which proceeds with reference to the accompanying drawings forming a part thereof and wherein:

BRIEF DESCRIPTION OF THE DRAWINGS

FIG. 3 is a block diagram illustrating how FIGS. 4A, 4B, 4C and 4D are to be arranged in order to illustrate the entire circuit means of the control system of this invention.

FIGS. 4A, 4B, 4C and 4D respectively illustrate parts of the entire electrical circuit means of the control system of this invention, FIGS. 4A-4D being adapted to be arranged in the manner illustrated in FIG. 3 to provide the entire circuit means for the control unit of FIG. 1.

DESCRIPTION OF THE PREFERRED EMBODIMENT

Figure 1:
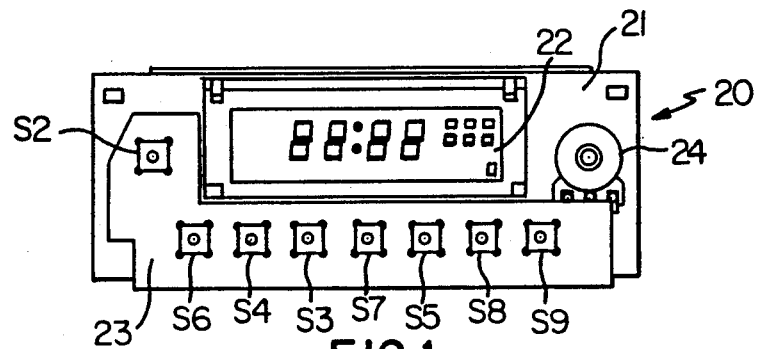
FIG. 1 is a schematic front view of a control unit of this invention that uses the control system of this invention that is illustrated in FIG. 2.

While the various features of this invention are hereinafter illustrated and described as being particularly adapted to provide a control system for controlling a domestic cooking oven or the like, it is to be understood that the various features of this invention can be utilized singly or in any combination thereof to provide a control system for controlling other apparatus or appliances as desired.

Therefore, this invention is not to be limited to only the embodiment illustrated in the drawings, because the drawings are merely utilized to illustrate one of the wide variety of uses of this invention.

Referring now to FIG. 1, the new control unit of this invention is generally indicated by the reference numeral 20 and comprises a frame means 21 having a visual display means 22, such as the well known vacuum fluorescent display means as set forth in the U.S. Pat. to Fowler, No. 4,568,927, and a user interface means 23 that comprise a rotary switch 24, such as one of the rotary switches as set forth in the U.S. Pat. to Fowler et al, No. 4,625,084, and eight momentary contact push buttons S2, S3, S4, S5, S6, S7, S8 and S9 of conventional design that remain in a normally open condition when released and therefore must be held closed by the user in a manner well known in the art whereby the aforementioned two U.S. Pat. Nos. 4,568,927 and 4,625,084, are being incorporated into this disclosure by the reference thereto.

The control unit 20 is a solid state, microcomputer based device capable of providing several advanced functions for home use, self-cleaning ovens. When used in conjunction with the appropriate temperature sensor and door lock assembly, the control unit 20 provides the following main functions: Time-of-Day Clock; Minute Timer with Alarm; Control of Oven Temperature in Bake, Broil, and Self-clean modes; Automatic Self-clean Mode; Delay start of Clean and Bake Modes; Timed Bake Modes and Control Output for Motorized Door Lock Mechanisms. Data entry is accomplished with the eight function keyes S2-S9 in conjunction with the rotary switch 24. The user selects a function with one of the keys S2-S9 and then enters data via the rotary switch 24, in the manner fully set forth in the aforementioned patents. Information is displayed to the user by means of the vacuum fluorescent display 22. Time and oven temperature information is displayed simultaneously. The display 22 is color coded for ease of identification with time information being blue-green and temperature information being red.

Figure 2:
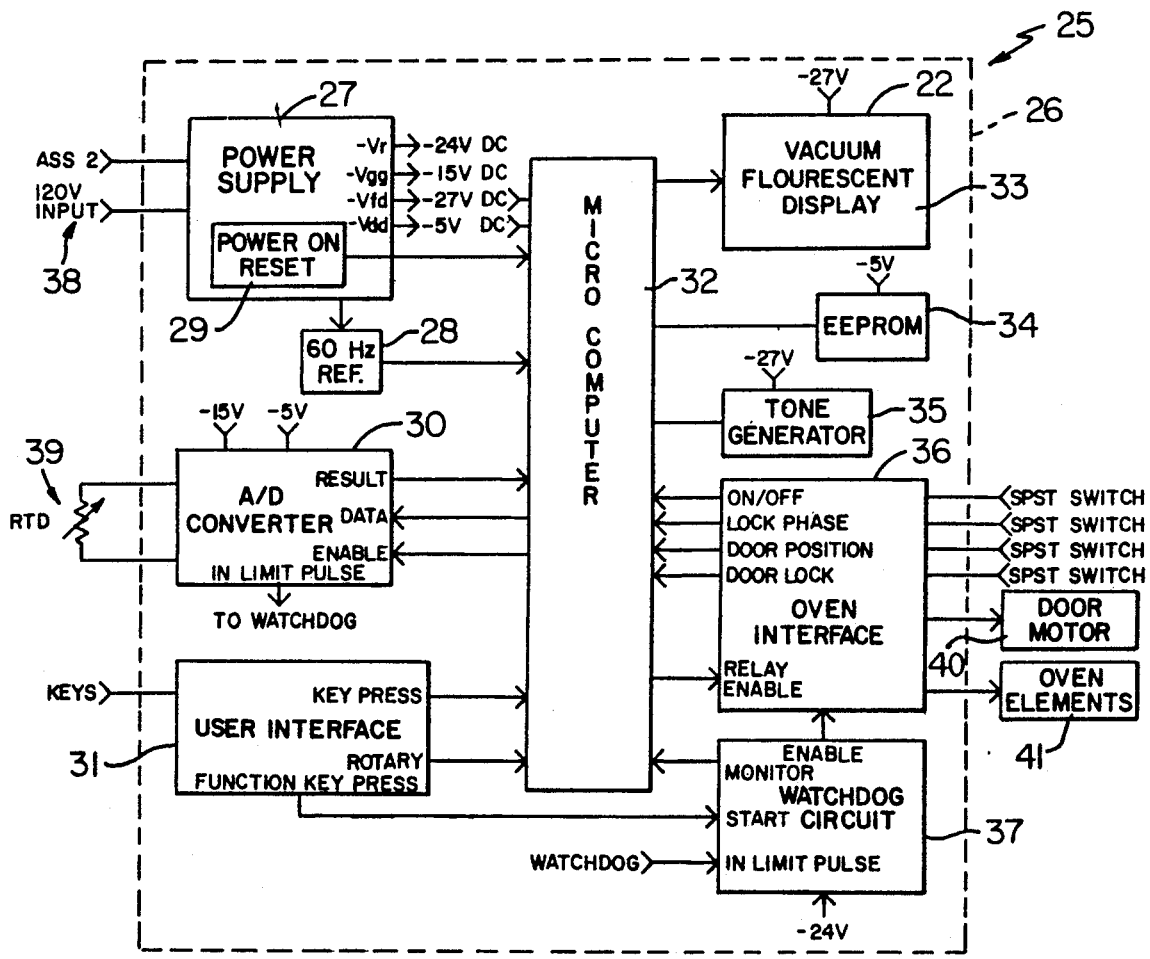
FIG. 2 is a block diagram illustrating the various circuit sections electrical circuit means of the control system of this invention for use in the control unit of FIG. 1, FIG. 2 being in block form and illustrates how the electrical circuit means is interconnected to external components to operate the same.
Figure 4B:
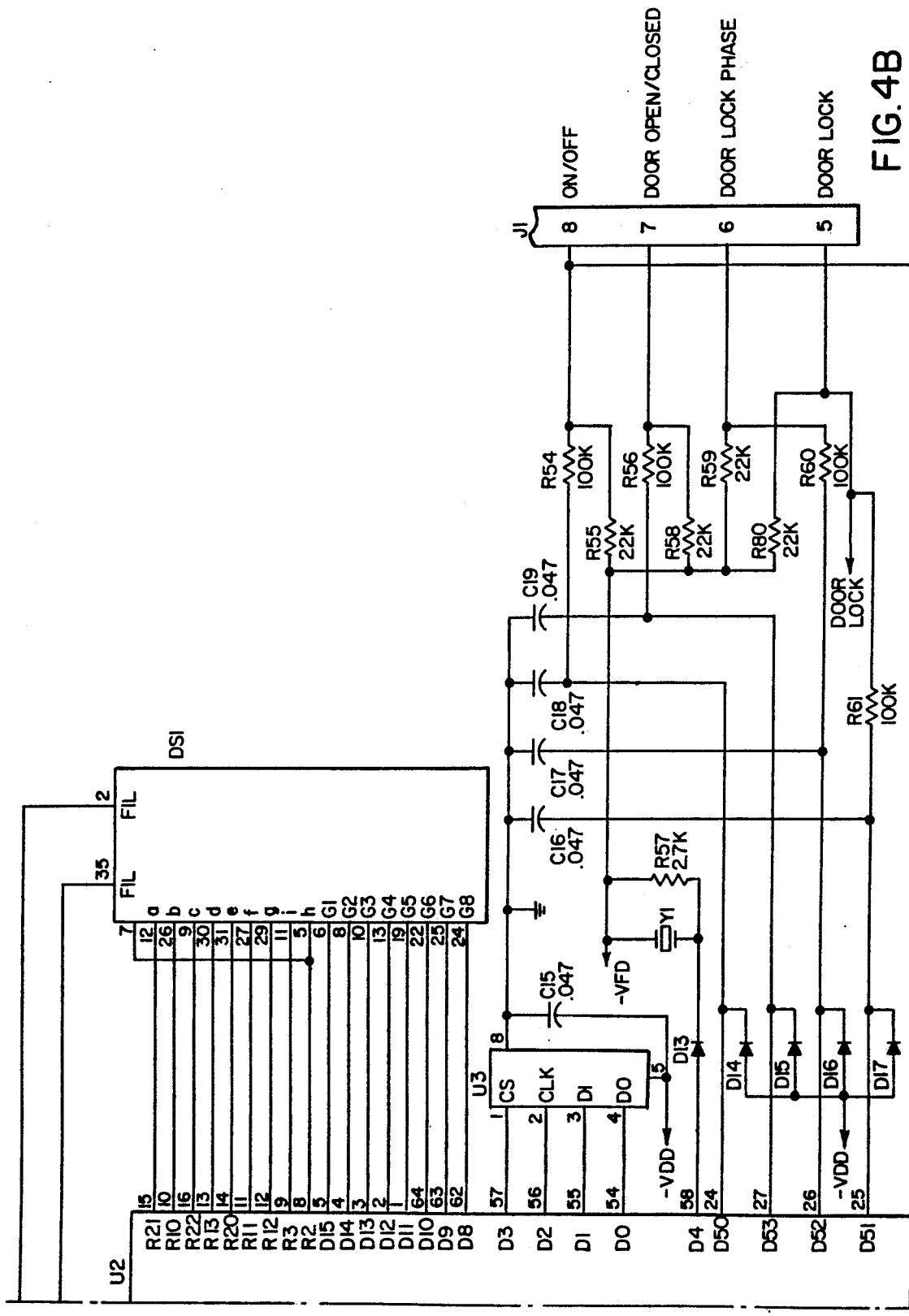
Figure 4C:
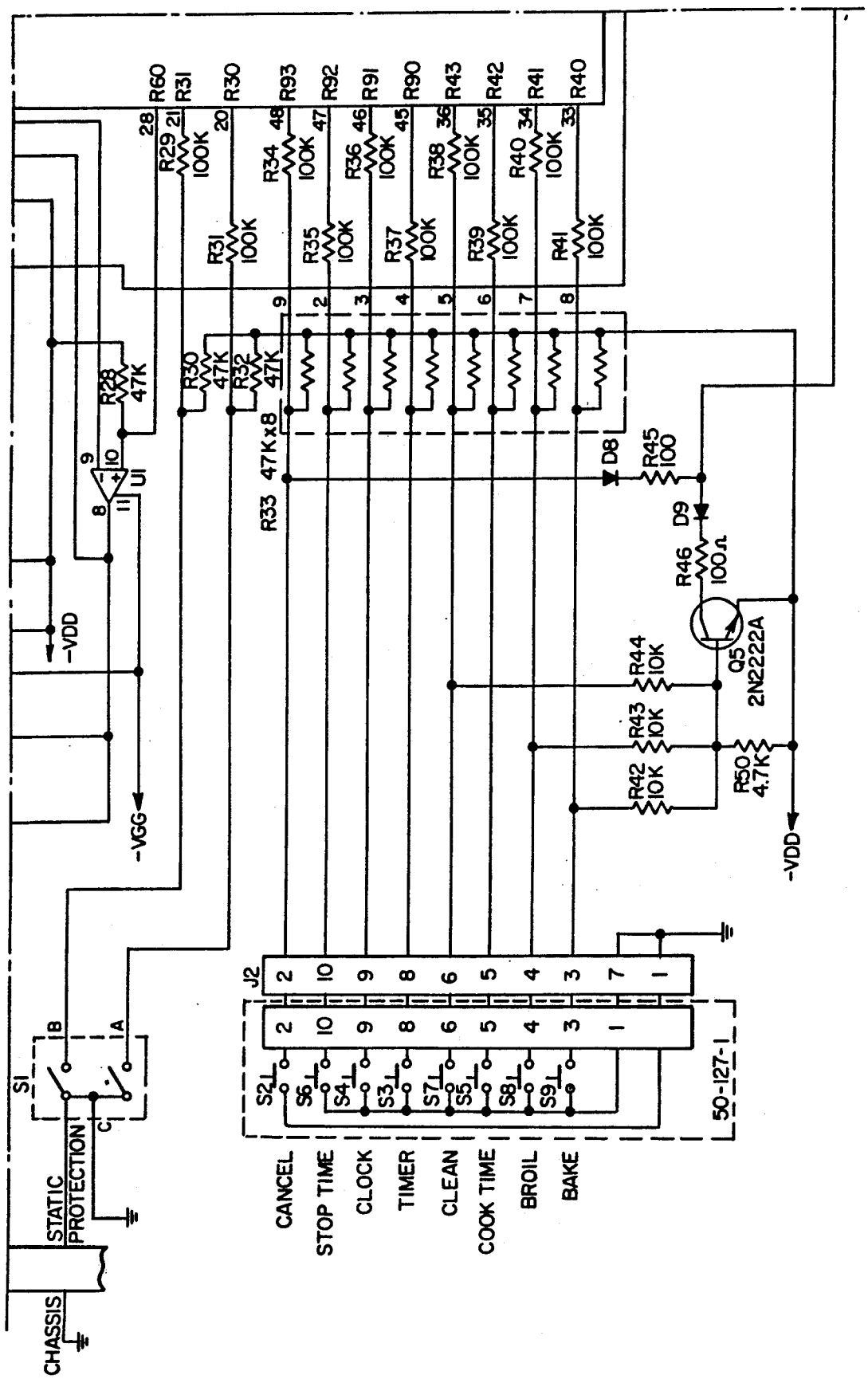
Figure 4D:
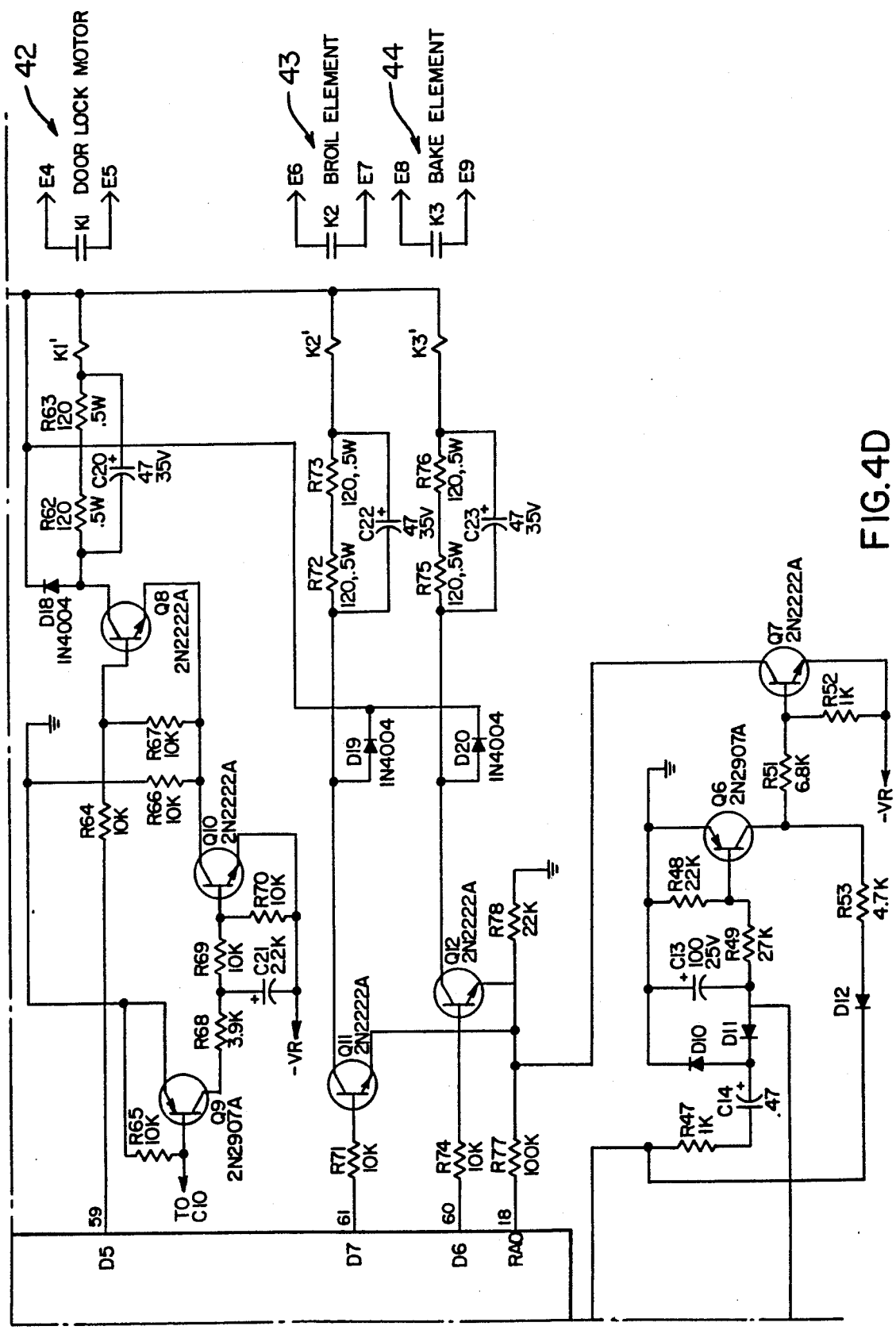

The control unit 20 has an electrical circuit means or control system of this invention therein which is generally indicated by the reference numeral 25 in FIGS. 2 and 4, the system or circuit means 25 being schematically illustrated by the dashed block 26 in FIG. 2 and containing sections of the electrical circuitry 25 as blocks 27, 28, 29, 30, 31, 32, 33, 34, 35, 36 and 37.

The block 27 comprises the electrical power supply for the control unit 20 and is adapted to be interconnected to an external power supply 38, FIG. 2, which comprises a Class 2, A.C. input and which in one working embodiment of the invention is 21 VAC, 50/60hz, the outputs of the power supply block 26 for the circuit 25 being −VR, −VRD, VDD and VGG.

The block 28 comprises a 60 hz reference generator to provide the real time reference signal utilized by the control unit 20 and the block 29 comprises a power on reset to provide a reset state for the control unit whenever insufficient voltage is available to properly power the control unit 20.

The block 30 is an A/D converter and is adapted to be interconnected to an external RTD temperature sensor 39 for the oven (not shown) of the cooking apparatus (not shown) using the control unit 20.

The block 31 is the user interface means of the circuitry 25 that contains the eight push buttons on keys S2-S9 and the rotary switch 24.

The block 32 comprises a microcomputer that is hereinafter referred to as U2 in this description and in FIG. 4 of the drawings, the microcomputer being conventional in the art and being programmed to function in a manner hereinafter set forth.

The block 33 comprises the display means 22.

The block 34 comprises a conventional EEPROM and is a sixteen by sixteen bit device that is hereinafter referred to as U3 in this description and in FIGS. 4A-4D of the drawings.

The block 35 comprises a free running oscillator U1 whose frequency is a nominal 2.45 KHZ and drives a piezo-electric speaker Y1.

The block 36 comprises an oven interface means that has three outputs and a software monitored input from an externally interconnected self-clean door lock mechanism, the outputs activating externally interconnected relays K1, K2 and K3 which, in turn, respectively activate the oven door lock motor that is schematically illustrated by its external block 40 of FIG. 2 and the oven bake element and oven broil element (as well as a down draft fan if required) that are schematically indicated by the external block 41 of FIG. 2.

The two outputs of the block 36 that control the heating elements must pass current through the block 37 prior to enabling the element relays K2 and K3, the block 37 comprising a watchdog circuit that supplies redundant control of the heating elements by requiring a mechanical key closure prior to allowing power to reach the relays that control the heating elements in a manner hereinafter set forth.

In general, the system 25 of this invention is the same as the system 25 of the aforementioned copending patent application, Ser. No. 939,872, filed Dec. 10, 1987, and since such copending patent application is now allowed and has the issue fee therefor paid, the copending patent application, Ser. No. 939,872, filed Dec. 10, 1987 is being incorporated into this application by this reference thereto.

Therefore, the system 25 of this invention will now be described in detail with the understanding that certain details of the components and the operation thereof that are not fully described hereinafter can be obtained from the aforementioned copending patent application. However, as previously stated, the new features of this invention concern the watch-dog or supervisory circuit means 37 and how the temperature sensing means controls the circuit means 37 and the door lock motor means 40 as will be apparent hereinafter.

In the following description of the system 25 as illustrated in FIGS. 4A-4D, all diodes are indicated by the reference letter D followed by a reference numeral, all resistances are indicated by the reference letter R followed by a reference numeral, all capacitors are indicated by the reference letter C followed by a reference numeral, and all transistors are indicated by the reference letter Q followed by a reference numeral. Also, unless otherwise indicated in the drawings, all capacitance values are in microfarads, 20% 50V; all diodes are 1N4148 and all resistance values are in ohms, + or −5%, 0.25 watt.

The power supply block 27 is of conventional construction as illustrated in FIG. 4A and provides these voltages.

The −VFD supply provides approximately −27 V D.C. It is unregulated, and consists of diode D1, diode D5 and capacitor C1. The A.C. output from the transformer secondary is applied to diode D1 and diode D5, forming a half-wave rectified signal used to charge capacitor C1. Capacitor C4 provides a RFI/EMI decoupling function. The large, 1000 microfarad, capacitor C1 is used because of the long power interruption withstand requirement placed on this design. Sufficient energy must be stored to allow continued microcomputer operation, without reset, for a maximum of 3.5 seconds after power is removed. To improve this ability still further, diode D4 also couples energy from the 470 microfarad capacitor in the −VR supply in the event of a power dip. This has practical value only if the relay outputs are off at the time of power interruption. This supply is used for the vacuum fluorescent display 22, the tone generator Y1 and the −15 volt regulator.

The −VR supply is of similar configuration to the −VFD supply. It is unregulated, and consists of diode D2, diode D3 and capacitor C3. The A.C. output from the transformer secondary is applied to diode D2 and diode D3, forming a half-wave rectified signal used to charge capacitor C3. This supply is used to provide power for the 24 V D.C. relay coils K1', K2' and K3'. It will provide approximately −24 V D.C. when loaded with 80 ma. of coil current from the relays K1, K2 and K3

Due to the configuration of diodes D1-D5, the −VFD supply is independent of the −VR supply. The two supplies are charged from opposite phases of the incoming A.C. voltage. This minimizes voltage fluctuations as loads change and balances the load placed on the power transformer.

The power transformer 38 must be of Class 2 construction and its output must be approximately 21 V A.C., 50/60 hz.

The −VGG supply provides a regulated source of low current −15 V D.C. It consists of resistor R9, transistor Q2 and zener diode Z3. Unregulated −27 V D.C. from the −VFD supply is applied to the collector of transistor Q2 through current limit resistor R11. The base of transistor Q2 is tied to the junction of resistor zener diode R9 and Z3, which form a voltage divider producing a stable −15.6 V D.C. derived from the −VFD supply. The circuits being powered by this supply become the emitter resistor for transistor Q2, whose current gain provides a stable source of voltage that is 0.6 V D.C. higher (due to Vbe rise of transistor Q2) than the reference voltage provided by zener diode Z3. Hence, a source of −15 V D.C. which maintains the voltage under varying load conditions. This supply is used to provide proper voltage for use by the A/D circuitry which decodes oven temperature. It is also used as a pre-regulator for the −VDD supply, which powers the microcomputer U2.

The −VDD supply provides a regulated source of low current −5 V D.C. It consists of resistor R7, resistor R10, transistor Q1, transistor Q3 and sener diode Z2. Regulated −15 V D.C. from the −VGG supply is applied to the collector of transistor Q3. The base of transistor Q3 is tied to the junction of resistor R7, resistor R10 and the emitter of transistor Q1 which form a voltage divider producing a stable 5.7 V D.C. derived from the −VGG supply. The circuits being powered by this supply become the emitter resistor for transistor Q3 whose current gain provides a stable source of voltage that is 0.6 V D.C. higher (due to the Vbe rise of transistor Q3) than the reference provided by transistor Q1. Hence a source of −5 V D.C. which is very stable due to the fact that the input source is already regulated. This supply is used to provide proper voltage for the microcomputer U2.

The power on reset block 29 comprises a circuit that provides a single pulse that is applied to a reset input pin 49 of the microcomputer U2. The function is to provide monitoring of the −VFD supply and to place the microcomputer U2 in a reset state whenever insufficient voltage is available to properly power the device. It does this by driving pin 49 high under insufficient voltage conditions, which is the reset state of this input.

As power is applied to the control, the −VDF supply voltage rises at a rate dependent on the value of capacitor C1 and the characteristic impedance of the power transformer. The base emitter junction of transistor Q1 and zener diode Z2 will not conduct until the −VFD voltage is greater than the combined voltage drops across these two components. With transistor Q1 off, the reset line is pulled to a high level, or logic one, by the current path through resistor R5. A logic one is the normal reset state. As the −VFD supply reaches approximately 5.7 V D.C., transistor Q1 will turn on and switch the reset line to a low level, or logic zero, through resistor R6 and enable normal microcomputer operation. When the −VFD supply decreases to a level that is not sufficient to maintain the bias current through zener diode Z2 and transistor Q1 base to emitter junction, transistor Q1 turns off and the reset line is pulled high level and the microcomputer U2 is in reset and stops operation. To improve the turn off threshold of transistor Q1 and allow bias current to flow through zener diode Z2 prior to transistor Q1 turning on, resistor R7 has been included in the circuit. Capacitor C2 has been added for noise immunity.

The 60 Hz reference generator block 28 comprises a circuit that provides the real time reference signal used by the microcomputer U2 to generate accurate Time-of-Day Clock, Timer, and other functions requiring consistent real time response. It is basically an inverting, single transistor amplifier, driven to saturation by a signal derived from the AC power line. This signal is taken directly from the power transformer. It is conditioned through a low pass filter to prevent errors due to electrical noise on the AC line, before being applied to the base of transistor Q4. The filter consists of resistor R13, resistor R14, capacitor C6 and resistor R12. Transistor Q4 inverts and squares up the incoming sinusoidal wave form before applying the resulting square wave signal to pin 23 of the microcomputer U2. Resistor R15 is merely a pull-down resistor, allowing the collector of transistor Q4 to swing between 0 and −5 V D.C. The function of capacitor C7 is to decouple radiated RFI, which could upset timing accuracy if not suppressed. Since failure of this circuit would result in the microcomputer U2 losing the capability to keep accurate time, this input is supervised in software. Inhibiting this signal will result in the error code —F6— being displayed, an audible alarm, and all outputs shut down.

The tone generator block 35 comprises a circuit that consists of tone generator Y1, diode D13 and resistor R57. The microcomputer U2 switches the state of output pin 58 thereof causing tone generator Y1, a piezoelectric tone generator, to oscillate at a frequency controlled by the switching speed of the output pin 58. Nominal speaker frequency is 2.45 KHZ. Tone duration is controlled by the time of oscillation. Pin 58 of the microcomputer U2 is coupled through diode D13 to the oscillator. Since this output of the microcomputer U2 is a 5 volt, CMOS output, the diode buffers the output from −27 volts. Resistor R57 provides current limiting to protect the output port.

The vacuum fluorescent display 22 is used to visually communicate the status of the control to the user. Feed back on which key was pushed, information on programmed operation, and error messages are all displayed. It consists of display DS1, resistor R1, resistor R2, resistor R3, resistor R4, and zener diode Z1. The resistors R1-R4 and zener diode Z1 are used to properly bias the filament of the display. The content of displayed information depends on the microcomputer U2, which uses a conventional multiplexing scheme to drive the 8 grid by 9 segment display.

The user interface block 31 contains a rotary switch 24 and eight inputs for eight external momentary contact push button switches S2-S9. Appliance operation is programmed by the user through use of these switches S2-S9.

The rotary switch 24 generates a two digit binary signal that is fed through resistor R29 and resistor R31 into the microcomputer U2, pins 20 and 21. Resistors R30 and R32 are pull-down resistors to −VDD so that proper logic level signals are generated. The microcomputer software decodes which direction the rotary switch 24 is being turned and increments or decrements the displayed reading accordingly.

The eight external momentary contact switches S2-S9 are used to select which function the input from the rotary switch 24 will program. Resistors R34-R41 are buffering/coupling resistors to the microcomputer U2 from the switches S2-S9 Sip resistor R33 provides a pull down to −VDD for each switch.

The function keys S9, S8, and S7 are respectively Bake, Broil, and Clean keys and are monitored in software for short circuit conditions that could cause unattended appliance operation. Any key held down for more than 45 seconds results in error −F5— and an audible alarm. The Bake, Broil and Clean keys are also connected to the element watchdog circuit block 37 and this circuitry will be hereinafter described.

One unique key is the Cancel key S-2. Because this design relies on this switch S-2 to provide a reliable, single button cancel of oven operation, its function is duplicated in hardware as well as software. The key S-2 is connected directly to the element watchdog circuit block 37 as well as to the micro U2. If resistor R34 fails open or the micro input port fails there will be no effect on ability of the cancel key S2 to turn all the elements off. If resistor R45 or diode D8 fail open the cancel key S2 will still input to the micro U2. The only failure condition not detectable in this manner is a Cancel key contact that will not close.

The oven interface block 36 consists of three relay outputs and four inputs. The outputs are simple transistor drivers Q8, Q11 and Q12 which activate external relays K1, K2 and K3 which in turn respectively activate the door lock motor 42, the oven broil element 43 and the oven bake element 44. The inputs monitor external switches.

When a Bake or Broil cycle is selected the corresponding output relay K3 or K2 is energized. The relays are cycled under microcomputer control to generate the desired oven cavity temperature for the entire cycle. An external ON/OFF switch 45, FIG. 7, will inhibit the relay cycling when open. This switch 45 completes the circuit to ground for the relay coils K1', K2' and K3'.

The Bake output driver circuit consists of resistor R74, resistor R75, resistor R76, capacitor C23, transistor Q12, and diode D20. When the microcomputer output pin 60 is switched to a logic high and the element watchdog circuit 37 is active and functioning properly, transistor Q12 switches power from the −VR supply into the K3 relay coil K3'. Diode D20 protects transistor Q12 from inductive kickback from the relay coil K3' at turn off. Capacitor C23 provides a voltage boost at turn on of the relay K3 for fast contact closure, and to assure pull in at high ambient temperatures. Resistors R75 and R76 provide a measure of current limiting for the relay coil K3' to reduce self heating in the coil K3' at the required hold in current. It was found necessary to use two resistors in series due to their self heating and derating at high temperatures.

The Broil output driver circuit consists of resistor R71, resistor R72, resistor R73, capacitor C22, transistor Q11, and diode D19. When the microcomputer output pin 61 is switched to a logic high and the element watchdog circuit 37 is active and functioning properly, transistor Q11 switches power from the −VR supply into the K2 relay coil K2'. Diode D19 protects transistor Q11 from inductive kickback from the relay coil K2' at turn off. Capacitor C22 provides a voltage boost at turn on of the relay K2 for fast contact closure, and to assure pull in at high ambient temperatures. Resistors R72 and R73 provide a measure of current limiting for the relay coil K2' to reduce self heating in the coil K2' at the required hold in current. It was found necessary to use two resistors in series due to their self heating and derating at high temperatures.

A failure of these circuits in the "on" condition would result in uncontrolled oven heating Therefore redundant control of these output drivers transistor Q11 and transistor Q12 is provided. Before current from the −VR supply can be supplied to the relay coil K2' or K3', the element watchdog circuit 37 must be active and functioning properly as hereinafter set forth.

The door lock motor output driver circuit consists of resistor R62, resistor R63, capacitor C20 and diode D18. Diode D18 protects transistor Q8 from inductive kickback from the relay coil K1' at turn off. Capacitor C20 provides a voltage boost at turn on of the relay K1 for fast contact closure, and to assure pull in at high ambient temperatures. Resistors R62 and R63 provide a measure of current limiting for the relay coil K1' to reduce self heating in the coil K1' at the required hold in current. It was found necessary to use two resistors in series due to their self heating and derating at high temperatures.

The door lock motor control circuit is composed of resistor R64, resistor R66, resistor R67 and transistor Q8. When the microcomputer output pin 59 is switched to a logic high and the door lock motor watchdog circuit is active and functioning properly, transistor Q8 switches power from the −VR supply into the K1 relay coil K1' provided transistor Q10 of the door lock watchdog circuit is enabled on.

A failure of transistor Q10 in the "on" or motor running condition would result in the oven door being unlocked and temperatures over 585° F. allowed by software limit. Therefore, redundant control of this output driver Q10 is provided. Before current from the −VR supply can be supplied to the relay coil K1', the door lock motor watchdog circuit must be active and functioning properly as hereinafter set forth.

Figure 7:
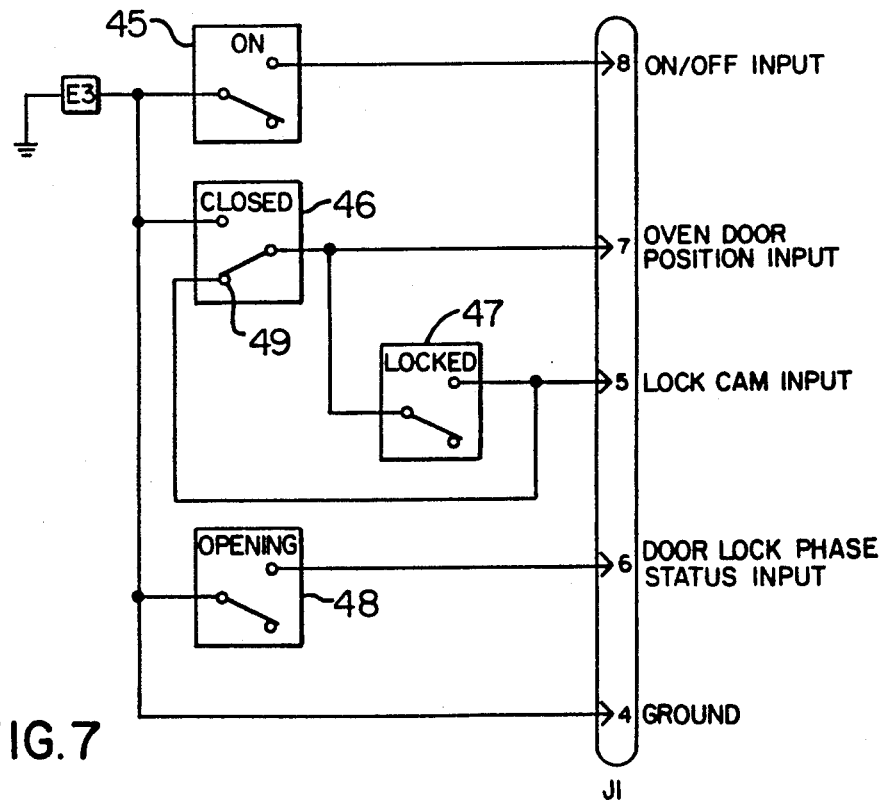
FIG. 7 is a schematic view of the oven door lock inputs.

Pin 24 of the microcomputer U2 is the ON/OFF switch input. This input switch 45, FIG. 7, is a single pole, single throw (SPST) type and is provided to signal the microcomputer U2 when all relay operation has been inhibited. This input also provides external, hard wire, redundant control of relay operation. This switch must be closed to complete the relay coil path to ground. The input circuit consist of resistor R54, resistor R55, capacitor C18 and diode D14. Resistor R54 is a buffering/coupling resistor of the microcomputer U2 from the switch. Resistor R55 provides a pull down to −VFD. Capacitor C18 provides RFI/EMI decoupling. Pin 24 of the microcomputer U2 is a low voltage pin. Diode D14 protects the pin 24 from the pull down to −VFD.

Pin 25 of the microcomputer U2 is the door lock status switch input. This input switch 47, FIG. 7, is a SPST type and is actuated by the lock cam on the door lock motor assembly. It is provided to signal the microcomputer U2 when the door lock motor 42 has locked the oven door, and because this input is connected to the door open/closed input through a SPDT type switch it signals when the door open closed input is shorted to ground. This switch also completes the circuit to ground for the voltage reference for the 935° F. oven temperature limit comparator U1 in the A/D circuit hereinafter set forth. The input circuit consists of resistor R61, capacitor C16 and diode D17. Resistor R61 is a buffering/coupling resistor to the microcomputer U2 from the switch. Capacitor C16 provides RFI/EMI de-coupling. Diode D17 protects the input pin 25.

Pin 26 of the microcomputer U2 is the door lock phase status switch input. This input switch 48, FIG. 7, is a SPST type and is actuated by the phase cam on the door lock motor assembly. It is provided to signal the microcomputer U2 when the door lock motor 42 is in the locking or unlocking portion of the lock cycle. The input circuit consists of resistor R59, resistor R60, capacitor C17 and diode D16. This circuit is identical in function to the input circuit for pin 24 described above.

Pin 27 of the microcomputer U2 is the door position switch. This input switch 46, FIG. 7, is DPST type and is actuated by the oven door. It is provided to signal the microcomputer U2 that the door is open or closed. The input circuit consists of resistor R56, resistor R58, capacitor C19 and diode D15. This circuit is identical in function to the input circuit for pin 24 described above.

Component failures of the input circuits, or the microcomputer inputs, must not allow a clean cycle when the oven door could be unlocked. All failures of these circuits will result in the termination of the clean cycle.

The A/D converter block 30 works in conjunction with the microcomputer U2 to decode the oven sensor resistance reading of the RTD sensor 39 into a digital format, which may then be processed using digital techniques for control of oven temperature. The A/D function is actually achieved by a D/A technique first, which is then decoded as an A/D result.

Custom circuit R22, in a SIP package, is an 8 bit R/2R resistance ladder network with additions made to allow this particular circuit arrangement to operate. It is a thick-film; screened device, laser trimmed for accuracy. The circuit is designed to be ratiometric to take advantage of this technology's inherent close tracking with temperature. The majority of the controller's accuracy and repeatability over wide temperature fluctuations is therefore established without adjustment at assembly plant. Aging characteristics are believed to also be excellent.

Pins 4–11 of circuit R22 form the D/A ladder portion of the circuit. These pins 4-11 are tied directly to CMOS outputs of the microcomputer U2. The microcomputer U2 drives these 8 pins 4–11 with a sequential binary code, which results in a staircase wave form appearing at the output pin 12 of the sip R22. For every output code there is a known, accurate, analog voltage present at pin 12 of the sip R22.

The output of the ladder network is then fed into op amp U1, pin 9, at the (−) input. This stage is configured as a unity gain, inverting amplifier, referenced to the −5 volt supply. Feedback and a resistor internal to sip R22 sets the gain and assures temperature stability of the gain. The output of this op amp stage is a staircase signal which starts at a −5 volt level and ramps down to a maximum of −10 volts at the highest output level of R22. This output voltage can be set to zero volts through use of the probe enable line, pin 28 of the microcomputer U2 which is tied to the (+) input of the op amp U1 at the pin 10 thereof. This function reduces power dissipation (self heating) in the oven sensor by shutting off this circuit when a reading is not required.

The output of op amp U1, pin 8, is used to apply a continuously varying voltage to the oven sensor 39. Resistors R23 and R26 are inserted in series with the probe 39 and serve to buffer the op amp U1 from abuses of the outside world by providing a measure of current limiting. The industry requirement that a single component failure cannot result in oven temperature exceeding the maximum set point by 50° F. requires using two resistors in series instead of one. Shorting either resistor will result in a maximum 44° F positive calibration error. Capacitor C11 provides protection from high frequency disruptions. The other end of the oven sensor is connected to resistor R16, which returns the probe circuit to board common. Resistor R16 is a precision, low temperature coefficient resistor which is used to establish a voltage reference.

The probe 39 used to sense oven temperature is a platinum resistive temperature device (RTD). This device 39 is exceptionally linear as to change in ohms per change in unit temperature (about 2 ohms per degree F). To decode temperature readings, an RTD is commonly excited with a constant current source and the voltage that results tracks temperature change very linearly. It was found to be more cost effective to modify this scheme slightly. Rather than excite the probe with a constant current, it is excited with the ramping voltage of the D/A converter. This ramp increases the voltage applied across the probe 39 and, for a given probe resistance, increases the current through the probe 39. As the temperature of the probe 39 increases, its resistance increases, and the voltage required to achieve a reference current through the probe 39 increases. Current through the probe circuit causes an accurate voltage to appear across resistor R16. This voltage is applied through impedance matching resistor R19, to the (−) input of op amp U1, pin 6. There, a comparison is made to a reference voltage established at pin 2 of the custom sip R22 and applied to the (+) input pin 5 of the op amp U1. This reference voltage is not a precise absolute value, but instead has a ratiometric relationship to the probe circuit voltage developed across resistor R16. It is approximately −3.48 volts. Because of the ratiometric relationship, the D/A output and the reference voltage from sip R22 will track accurately, independent of power supply voltage. This eliminates the need for a tightly controlled power supply to maintain accuracy.

The result of this comparison is relayed to the microcomputer U2 through buffer resistor R20 from the op amp output, pin 7. When the voltage across resistor R16 is more negative than the reference voltage from the sip R22, the output swings high and signals the microcomputer U2 to stop the D/A ramp. The binary value necessary to produce the current level through the RTD sensor 39 is decoded through software as a temperature value. Resistor R18 acts as a pull-up to assure proper logic levels for the microcomputer U2.

Capacitor C8 provides a little positive feedback to the op amp U1 to speed the transition rate of the comparison.

The A/D circuit also works in conjunction with the microcomputer U2 and discrete components to check the temperature of the oven cavity and limit the operation of the oven elements 43 and 44 to below 635° F. for normal cooking operations or to below 935° F. for cleaning operation provided the oven cavity door is locked, and limit the operation of the motorized door lock motor 42 to below 535° F. for such cleaning operation.

To test for the 635° F. limit during a normal cooking operation, all 8 output lines 37–44 from the microcomputer U2 are pulsed high, giving the maximum output from the D/A ladder network R22. This voltage is input to the op amp U1, pin 9 and causes the output, pin 8, to go to −10 V D.C. The output from pin 8 of op amp U1 is applied to the oven sensor 39 and the voltage produced across resistor R16 is applied through impedance matching resistor R19 to the (+) input of op amp U1, pin 3. A comparison is made to a reference voltage established by resistor R79, resistor R17 and resistor R27, which are precision, low temperature coefficient resistors that form a voltage divider applied to the (−) input of op amp U1, pin 2. If the voltage across resistor R16 is more negative than the divider voltage, the output of op amp U1, pin 1, will pulse low. If the voltage across resistor R16 is more positive, the output will remain high.

As the temperature of the probe 39 increases, so does the voltage drop across it. This results in smaller voltages input to the (+) input of op amp U1, pin 3. The value of the voltage applied to the op amp U1 from the divider network has been chosen such that at 635° F., the result of the comparison will not allow the output from pin 1 of the op amp U1 to swing low. This results in a loss of the dynamic or pulsing signal that keeps the watchdog circuit 37 enabled which is described hereinafter.

The test for the 935° F. limit during a cleaning operation is similar to the 635° F. test. The 8 output lines 37–44 from the microcomputer U2 are pulsed high, giving the maximum output from the D/A ladder network R22. This voltage is input to the op amp U1, pin 9, and causes the output, pin 8, to go to −10 V D.C. The output from pin 8 of the op amp U1 is applied to the oven sensor 39 and the voltage produced across resistor R16 is applied through impedance matching resistor R19 to the (+) input of op amp U1, pin 3. A comparison is made to a reference voltage established by resistor R17 and resistor R27, which are precision, low temperature coefficient resistors that form a voltage divider applied to the (−) input of op amp U1, pin 2. If the voltage across resistor R16 is more negative than the divider voltage, the output of op amp U1, pin 1, will pulse low. If the voltage across resistor R16 is more positive, the output will remain high.

As the temperature of the probe 39 increases, so does the voltage drop across it. This results in smaller voltages input to the (+) input of op amp U1, pin 3. The value of the voltage applied to the op amp U1 from the divider network has been chosen such that at 635° F. the result of the comparison will not allow the output from pin 1 of the op amp U1 to swing low.

The reference voltages established by resistor R17, resistor R27 and resistor R79 are dependent on the status of the door lock. If the door is locked, resistor R17 is grounded through diode D6 and the door lock switch and the reference voltage that is established by resistor R17 and resistor R27 will allow oven operation up to 935° F. If the door is not locked, resistor R17 is in series with resistor R79 and the reference voltage established by resistor R17, resistor R79 and resistor R27 will allow oven operation up to 635° F.

Oven temperature is tested by the microcomputer U2 against the 635° F./935° F. limits before every test against set temperature and every test for set temperature occurs approximately once every second of operation of the system 25. If the oven cavity temperature is outside of the proper limit for the cycle in progress, the watchdog circuit 37 will no longer operate and the programmed cycle is reset and the oven elements 43 and 44 are turned off.

The heart of the safety logic is contained in watchdog circuit 37. The purpose is to supply redundant control of the heating elements 43 and 44 requiring a mechanical key closure prior to allowing power to reach the relays K2 and K3 that control the heating elements 43 and 44 and providing a hardware shut off to remove power from the relays K2 and K3. Once a cooking cycle has been initiated, a dynamic signal from the A/D circuitry is required to sustain cooking. This dynamic signal is only generated if the microcomputer U2 is functioning sufficiently to operate the A/D circuit 30 and therefore to regulate the oven temperature. In addition, the watchdog hardware 37 is monitored with microcomputer U2 through software to assure that the circuit 37 is functioning properly before allowing a heating mode to occur. This monitoring is continuous, and will result in a failure alarm should a fault be detected Any single component fault of this circuit 37 will result in a safe shut down, with the user being required to repair the fault prior to restoring use of the oven.

Should a single component failure in the bake or broil relay driver circuits result in the microcomputer U2 being unable to shut the relays K2 and K3 off during temperature regulation, the temperature in the oven will rise until the bake or clean temperature limits are reached. At this point the temperature limit comparators U1 can no longer provide the dynamic signal to the watchdog circuit 37. The watchdog circuit 37 shuts off and removes power from the relays K2 and K3 in that manner. The microcomputer U2 will sound an alarm and display an error code.

Supervisory transistor Q7 is a redundant controlling element in series with the bake and broil relay driver transistors Q11 and Q12. Transistor Q7 must be on prior to either of these relays K2 and K3 receiving power. In order to turn transistor Q7 on, the following sequence must occur.

A function key S9, S8 or S7 (bake, broil or clean) must be pressed in the User Interface circuit 31 that is attached through resistors R42–R44 to the base of transistor Q5. The base of transistor Q5 is also tied to −VDD through resistor R50. The voltage created by the divider composed of resistor R42, or resistor R43, or resistor R44 and resistor R50 when a function key is pressed, is enough to turn transistor Q5 on but not enough to feed back false key press information to the microcomputer U2. When the transistor Q5 is turned on, current flows from −VDD through the emitter-collector junctions of transistor Q5, through current limit resistor R46, isolation diode D9 and into the branch circuit at the junction of diode D11, capacitor C13 and resistor R49. Here, the current splits two ways, one path charging capacitor C13 from the −VDD supply, and the other path causing sufficient current to flow into the base-emitter junction of transistor Q6 and resistor R48 to cause transistor Q6 to switch on in a saturated mode from emitter to collector. When the transistor Q6 turns on, current flows into the base emitter junction of transistor Q7 and resistor R51 to cause transistor Q7 to switch on in a saturated mode from collector to emitter. Transistor Q7 which is connected to the emitters of the Bake and Broil relay driver transistors Q12 and Q11 is now allowing current from the −VR supply to reach these drivers Q12 and Q11. This, in effect, "enables" the drivers Q12 and Q11. This "enabling" does not turn relays K2 and K3 on until the drivers Q12 and Q11 are also instructed to do so by the microcomputer U2 which occurs later in the sequence.

The microcomputer U2 must recognize that a key has been pressed in the User Interface curcuit 31. Due to software de-bounce, the function key must be held down long enough for capacitor C13 to receive an adequate charge to keep transistor Q6 "on" upon release of the key. If it is not held long enough, the microcomputer U2 simply ignores the key press and transistor Q6 turns off because capacitor C13 discharges. When transistor Q6 turns off, transistor Q7 turns off and the relay drivers Q12 and Q11 are disabled.

Assuming the key S9, S8 or S7 has been properly pressed, the microcomputer U2 will decode it as an oven operating function and start the A/D operating cycle. As previously stated, part of the A/D cycle is testing the oven temperature against 635° F./935° F. limits. If the oven temperature is within limits, a low output pulse from pin 1 of the oven temperature limit comparator U1 is generated. The limit comparator U1 is diode isolated from the watchdog circuit 37 by diode D7. The signal pulses at about a 120 Hz rate and is AC coupled through capacitor C14 and resistor R47 into the junction of diode D10 and diode D11.

Since the pulse generated by the limit comparator U1 is only able to sink current to −VGG, capacitor C14 is able to provide a "keep alive" current flowing into capacitor C13 only if the transistor Q6 was on prior to the start of the A/D operation. This is because the discharge path for capacitor C14 is through diode D12 and resistor R53 and is only available if transistor Q6 is on.

The low pulse from pin 1 of the limit comparator U1 causes current to flow through the series circuit of resistor R47, resistor C14, diode D11 and capacitor C13. Due to the relative values of capacitor C14, 0.47 microfarad, and capacitor C13, 100 microfarad, a single charge cycle, will not produce sufficient voltage across capacitor C13 to energize transistor Q6 unless several more closely spaced pulses occur. Since capacitor C13 was previously charged and transistor Q6 turned "on", by a key press, a discharge path for capacitor C14 is provided, when the signal from the limit comparator U1 is high, through the path of diode D10, transistor Q6 emittercollector, resistor R53, diode D12 and resistor R47. This discharge cycle allows current to flow from capacitor C14 into capacitor C13 on the next low pulse from the limit comparator. A pumping action results that charges capacitor C13 to an equilibrium value of about 14 V D.C. as long as the 120 Hz signal remains present. This is sufficient to keep transistor Q6 energized. If the temperature limit comparator U1 stops pulsing in either a high or low state, the pumping action of capacitor C14 into capacitor C13 stops, and capacitor C13 then discharges through resistor R48 and resistor R49, resulting in transistors Q6 and Q7 shutting off. It would require a key press before transistors Q6 and Q7 could once again be turned on.

To insure that no hardware malfunctions have occurred that would cause transistor Q6 to turn on without the proper key sequence and sustaining signal, a simple monitoring scheme is employed. Pin 18 of the microcomputer U2 is the watchdog monitor input. Through resistor R77, the state of the collector of transistor Q7 is checked on a continuous basis. An alarm sounds and the relay driver outputs are inhibited if the collector of transistor Q7 is in the wrong state for the present operating mode of the control. For example, if transistor Q7 is detected as being "on" for more than a few seconds with no cooking function selected, an alarm sounds and a characteristic failure code appears in the display Conversely, if transistor Q7 if "off" during a legitimate cook or clean cycle, the mode is cancelled. This failure is not a safety concern, but the appliance will not cook under this condition.

Through this handshaking arrangement of hardware and software, it is impossible for a single open or shorted component to cause an unattended start of the appliance. The failure analysis confirms that the watchdog circuitry 37 inhibits operation in the event of a microcomputer U2 failure and the microcomputer U2 protects against a hardware failure.

Similar to the oven temperature comparator limits, the D/A circuit 30 also provides a door lock limit comparator. This limit is typically 535° F. and has the function of inhibiting operation of the door lock motor 42 above the limit established by specification of discrete components.

To test for the 535° F. limit, all 8 output lines 37–44 from the microcomputer U2 are pulsed high, giving the maximum output from the D/A ladder network R22. This voltage is input to the op amp U1, pin 9, and causes the output, pin 8, to go to −10 V D.C. The output from pin 8 is applied to the oven sensor 39 and the voltage produced across resistor R16 is applied through impedance matching resistor R19 to the (+) input of op amp U1, pin 3. A comparison is made to a reference voltage established by resistor R21 and resistor R25 which are precision, low temperature coefficient resistors that form a voltage divider applied to the (−) input of op amp U1, pin 13. If the voltage across resistor R16 is more negative than the divider voltage, the output of op amp U1, pin 14 will pulse low. If the voltage across resistor R16 is more positive, the output will remain high.

As the temperature of the probe 39 increases, so does the voltage drop across it. This results in smaller voltages input to the (+) input of op amp U1, pin 12. The value of the voltages applied to the op amp U1 from the divider network has been chosen such that at 535° F., the result of the comparison will not allow the output from pin 14 of the op amp U1 to swing low.

Oven temperature is tested against the 535° F. limit before every test against set temperature. If the oven cavity temperature is outside of the proper limit for the motorized door lock operation, the dynamic signal to the door lock watch-dog circuit 37 will be inhibited. This will inhibit operation of the door lock motor 42 as explained hereinafter.

Another purpose of the watchdog circuit 37 is to provide redundant control of the door lock motor 42, requiring the dynamic signal generated by the A/D and the door lock temperature limit comparator U1 prior to allowing power to reach the relay K1 that controls the door lock motor 42, and providing a hardware shutoff to remove power from the door lock motor 42. This dynamic signal is only generated if the microcomputer U2 is functioning sufficiently to operate the A/D and therefore to regulate the oven temperature. In addition, the watchdog hardware is monitored through software to assure that the circuit 37 is functioning properly before allowing the door lock relay K1 to operate. Should a fault be detected, this monitoring will result in a failure alarm. Any single component fault of this circuit will result in not being able to operate the door lock motor 42 or start a clean cycle. The fault must be repaired prior to restoring full use of the oven.

Should a single component failure in the door lock relay driver circuit result in the microcomputer U2 being unable to shut the relay K1 off, the temperature in the oven will rise until the door lock temperature limit is reached. At this point the temperature limit comparator U1 can no longer provide the dynamic signal to the watchdog circuit 37. The watchdog circuit 37 shuts off, and removes power from the relay K1 in this manner. The microcomputer U2 will sound an alarm and display a failure code.

Supervisory transistor Q10 is the redundant controlling element in series with the door lock relay driver transistor Q8. It must be on prior to this relay receiving power. In order to turn transistor Q10 on, the following sequence must occur.

The Clean function key 57 must be pressed in the User Interface circuit 31 to start the A/D operating cycle. As previously stated, part of the A/D cycle is used to test the oven temperature against the 525° F. limit. If the oven temperature is within limits, a low output pulse from pin 14 of the door lock temperature limit comparator U1 is generated. The signal pulses at about a 120 Hz rate and is AC coupled through capacitor C10 and resistor R24 into the base of transistor Q9.

A low pulse from pin 14 of the limit comparator U1 causes transistor Q9 to turn on. When transistor Q9 turns on, current flow will begin to charge capacitor C21. A single pulse will not produce enough voltage across capacitor C21 to turn resistor Q10 on. Only if there is a continuous series of charge pulses will capacitor C21 charge enough to turn transistor Q10 on and keep it on. If the door lock temperature limit comparator stops pulsing in either a high or low state, capacitor C9 will turn off and the pumping of charge into capacitor C21 will stop. Capacitor C21 then discharges through resistor R69 and resistor R70, resulting in transistor Q8 shutting off.

To insure that no hardware malfunctions have occurred that enable the door lock motor 42 to run without the proper key sequence and sustaining signal, a simple monitoring scheme is employed. Pin 59 of the microcomputer U2 is the door lock motor control output. When it is needed to monitor the door lock hardware, however, this pin 59 is reconfigured for input. Through resistors R64 and R67, the state of the emitter of transistor Q10 can be checked. If transistor Q10 is detected as being "on" for more than a few seconds with the oven temperature above the motor disable temperature, an alarm sounds and a characteristic failure code appears in the display 22.

Through this handshaking arrangement between hardware and software, it is impossible for a single component failure to allow the door to unlock when the oven temperature is above 585° F. The failure analysis confirms that the watch-dog circuitry 37 inhibits operation in the event of microcomputer U2 failure, and the microcomputer U2 inhibits operation in the event of a hardware failure.

Figure 5:
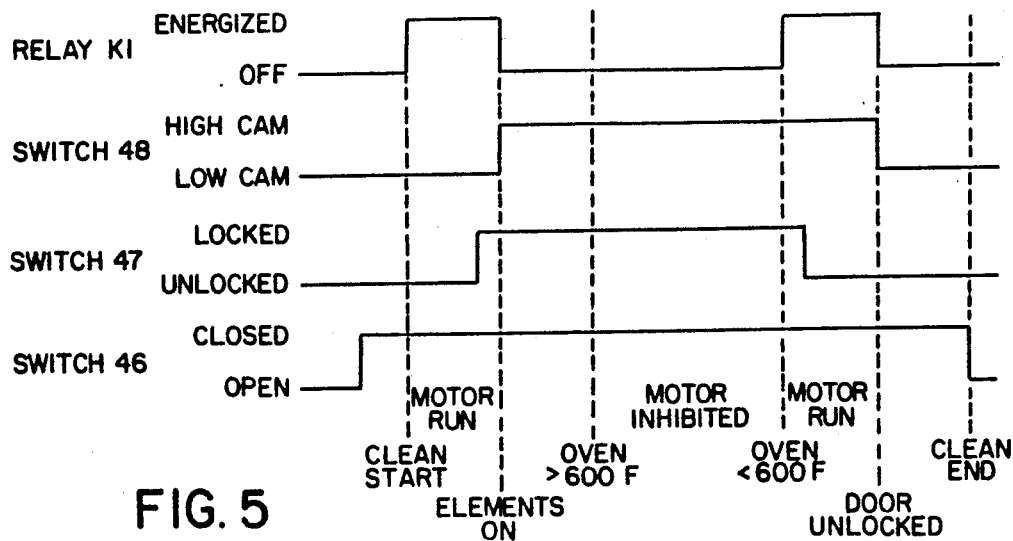
FIG. 5 is a schematic view of the oven door lock timing feature of the system of FIGS. 4A-4D.

The control system 25 operates with suitable mechanism for locking the oven door while cleaning. For example, the motorized door lock assembly (not shown) can consist of a 115 V A.C. gear motor 42, a phase cam and a lock cam on the motor shaft, and a DPST switch 46, FIG. 7, and two SPST switches 47 and 48, FIG. 7. Refer to FIG. 5 for door lock timing.

Figure 6:
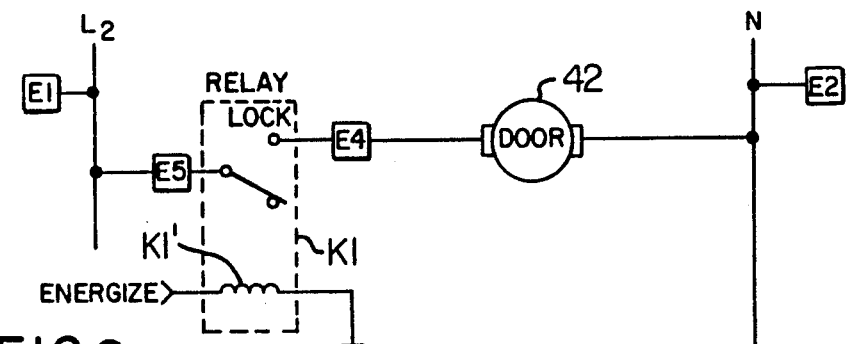
FIG. 6 is a schematic view of the oven door lock circuit.

FIG. 5 illustrates door lock timing and FIGS. 6 and 7 respectively illustrate the wiring for the door lock motor 42 and the external wiring for the door lock inputs to the system 25.

To lock the oven door, the output relay K1 for the door lock motor 42 is energized and operates until the lock cam on the motor shaft causes the door lock status switch 47 to close and the phase cam causes the door lock phase switch 48 to close. When both of these switches 47 and 48 are closed the output relay K1 is de-energized by the microcomputer U2. A Clean cycle will not start unless both of these switches 47 and 48 and the door position switch 46 are closed.

The motorized door lock assembly must not attempt to lock the oven door unless the door is shut. To insure that a short to ground in the door position input line does not cause the microcomputer U2 to run the door lock motor 42 when the door is open, a simple monitoring scheme is employed. The normally closed contact 49 of the DPST door position switch 46 is connected to the lock status input. A short to ground in the door position switch wiring will result in the door appearing locked without the door lock phase input being closed. This will cause an alarm to sound and a characteristic failure code to appear in the display 22.

To unlock the door the output relay K1 for the door lock motor 42 is energized by the microcomputer U2 and the door lock motor 42 operates until the phase cam on the motor shaft causes the door lock phase switch 48 to open. When this switch 48 opens the output relay K1 is de-energized.

Thus, it can be seen that this invention provides a new control system and a new method of operating such a control system as well as a new method of making such a control system.

While the forms and methods of this invention now preferred have been illustrated and described as required by the Patent Statute, it is to be understood that other forms and method steps can be utilized and still fall within the scope of the appended claims wherein each claim sets forth what is believed to be known in each claim prior to this invention in the portion of each claim that is disposed before the terms "the improvement" and sets forth what is believed to be new in each claim according to this invention in the portion of each claim that is disposed after the terms "the improvement" whereby it is believed that each claim sets forth a novel, useful and unobvious invention within the purview of the Patent Statute.

What is claimed is:

1. In a control system for a cooking oven having a heating means and an oven door, said system comprising a high energy control circuit means having an output relay driver transistor for operating an oven door latching motor means of said system, manually operated means for initiating the operation of said high energy control circuit means, microcomputer means for operating said high energy control circuit means after said manually operated means has initiated the operation of said high energy control circuit means, and supervisory circuit means for detecting failure of said system and disabling said high energy control circuit means if said system is not operating in a normal mode thereof, the improvement wherein said supervisory circuit means has a supervisory transistor therein that is in series with said relay driver transistor and that must be switched on to enable said relay driver transistor, said supervisory circuit means having means therein for sustaining the on condition of said supervisory transistor, said system having operating means for initially switching on said supervisory transistor to initiate the operation of said high energy control circuit means, said operating means being adapted to continue the on condition of said relay driver transistor after the initial switching on thereof if said system is operating in a normal mode thereof, said microcomputer means having monitoring means for monitoring the state of said supervisory transistor.

2. A control system as set forth in claim 1 wherein said operating means has manually operated means that initially switches on said supervisory transistor to initiate the operation of said high energy control circuit means when said manually operated means is manually operated.

3. A control system as set forth in claim 2 wherein said microcomputer comprises said operating means for continuing said on condition of said relay driver transistor after said initial switching on thereof.

4. In a control system for a cooking oven having a heating means and an oven door, said system comprising a high energy control circuit means having an output relay driver transistor for operating an oven door latching motor means of said system, manually operated means for initiating the operation of said high energy control circuit means, microcomputer means for operating said high energy control circuit means after said manually operated means has initiated the operation of said high energy control circuit means, and supervisory circuit means for detecting failure of said system and disabling said high energy control circuit means if said system is not operating in a normal mode thereof, the improvement wherein said supervisory circuit means has a supervisory transistor therein that is in series with said relay driver transistor and that must be switched on to enable said relay driver transistor, said supervisory circuit means having a capacitor therein for sustaining the on condition of said supervisory transistor, said system having operating means for initially charging said capacitor and switching on said supervisory transistor to initiate the operation of said high energy control circuit means, said operating means being adapted to continue the charging of said capacitor after the initial charging thereof if said system is operating in a normal mode thereof, said operating means for continuing the charging of said capacitor comprising temperature sensing means that continues the charging of said capacitor only as long as said temperature sensing means is sensing an output temperature effect of said heating means that is below a predetermined high temperature limit for said system and that terminates the the charging of said capacitor when said sensed temperature is above said predetermined high temperature limit, said microcomputer means having monitoring means for monitoring the state of said supervisory transistor.

* * * * *

UNITED STATES PATENT AND TRADEMARK OFFICE
CERTIFICATE OF CORRECTION

PATENT NO. : 5,015,827
DATED : May 14, 1991
INVENTOR(S) : Brian J. Kadwell et al It is certified that error appears in the above—identified patent and that said Letters Patent is hereby corrected as shown below:

Notice [*]   On the title page:

The term of this patent subsequent to May 1, 2007, has been disclaimed.

On the title page: after Item[73] Assignee insert

Item [45] before "July 5, 1983" insert an asterick, "*".

Signed and Sealed this

Eighth Day of November, 1994

Attest:

BRUCE LEHMAN

Attesting Officer    Commissioner of Patents and Trademarks